(12) United States Patent
Chen

(10) Patent No.: US 6,579,812 B2
(45) Date of Patent: Jun. 17, 2003

(54) METHOD FOR REMOVING RESIDUAL POLYMER AFTER THE DRY ETCHING PROCESS AND REDUCING OXIDE LOSS

(75) Inventor: Chung-Tai Chen, Hsin-Chu (TW)

(73) Assignee: Macronix International Co Ltd. (TW)

( * ) Notice: Subject to any disclaimer, the term of this patent is extended or adjusted under 35 U.S.C. 154(b) by 0 days.

(21) Appl. No.: 09/861,566

(22) Filed: May 22, 2001

(65) Prior Publication Data
US 2002/0177309 A1 Nov. 28, 2002

(51) Int. Cl.⁷ .................................................. H01L 21/31
(52) U.S. Cl. ........................ 438/780; 438/197; 438/689; 438/696; 438/704; 438/703; 438/706; 438/723; 438/724; 438/725; 438/740; 438/745
(58) Field of Search ................................ 438/197, 689, 438/696, 704, 703, 706, 723, 724, 725, 740, 745, 780

(56) References Cited
U.S. PATENT DOCUMENTS 5,541,434 A * 7/1996 Nicholls et al. ............ 257/383
6,129,091 A * 10/2000 Lee et al. .................... 134/2
6,242,350 B1 * 6/2001 Tao et al. .................... 134/1.2
6,258,678 B1 * 7/2001 Liaw .......................... 438/303
6,329,292 B1 * 12/2001 Hung et al. ................. 438/706

\* cited by examiner

Primary Examiner—Kamand Cuneo
Assistant Examiner—Lisa Kilday

(57) ABSTRACT

First of all, a semiconductor substrate that has a memory array and a periphery region thereon is provided, wherein the memory array and the periphery region have a conducted layer, individually. Then an oxide layer or an oxide-nitride-oxide layer is formed on the conducted layer. Afterward, forming a photoresist layer on the oxide layer and defining the photoresist layer of the periphery region. The oxide layer and the conducted layer of the periphery region are etched until exposing the substrate surface of the periphery region by way of using a dry etching process and the photoresist layer as an etching mask. After the dry etching process is finished, a protected layer of the polymer will be formed on the etched sidewalls, so as to keep the etched profile. A wet etching process having a ultra dilute hydrofluoric acid (UDHF)or a mixed-acid solution SC1 is then performed to strip the protected layer of the polymer, so as to avoid the oxide loss.

7 Claims, 5 Drawing Sheets

METHOD FOR REMOVING RESIDUAL POLYMER AFTER THE DRY ETCHING PROCESS AND REDUCING OXIDE LOSS

BACKGROUND OF THE INVENTION

1. Field of the Invention

The present invention relates generally to a method for removing a polymer, and more particularly to a process for removing a polymer and reducing oxide loss.

2. Description of the Prior Art

As semiconductor devices, such as Metal-Oxide-Semiconductor devices, become highly integrated the area occupied by the device shrinks, as well as the design rule. With advances in the semiconductor technology, the dimensions of the integrated circuit (IC) devices have shrunk to the deep sub-micron range. When the semiconductor device continuously shrinks in the deep sub-micron region, some problems described below are incurred due to the process of scaling down.

The evolution of integrated circuits has evolved such that scaling down the device geometry is required. In the deep sub-micron technology of semiconductors, it's necessary that the protected layer of polymer be formed on the etched sidewall by way of using a reactive gas with a high Carbon/Fluorine (C/F) ratio in order to control the etched profile. Nevertheless, before the next process, the protected layer of polymer has to be stripped, otherwise poor results during the follow-up processes may occur. In general, the method for stripping the protected layer of polymer is a wet etching process. For the conventional wet etching process, a large amount of the oxide layer will be lost when the polymer is stripped. Controlling the thickness of the oxide layer is very important in the below deep sub-micron region. Especially, when the design rule is scaled down, it is more difficult to control or keep the thickness of the oxide layer.

Furthermore, in the conventional wet etching process, the sacrificing oxide layer reduces about 20 to 30 Å during the polymer stripping, with a possibility of the oxide layer being totally removed. If the thickness of the sacrificing oxide layer is to thin, it will affect the follow-up implanting process. On the other hand, the Oxide-Nitride-Oxide layer that is the stacked structure on the memory array or periphery region, the thickness of the oxide layer must be exactly controlled. If the thickness of the oxide layer experiences a great loss during the conventional wet etching process, a possible shift in electricity will reduce the performance of the device. Therefore, the conventional process for removing the polymer is a complex process. The thickness of the oxide layer is hard to control, and will not rework, this in return increases cost.

In accordance with the above description, a new and improved method for removing the residual polymer is therefore necessary, so as to raise the yield and quality of the follow-up process.

SUMMARY OF THE INVENTION

In accordance with the present invention, a method is provided for removing the residual polymer that substantially overcomes the drawbacks of the above mentioned problems that arise from conventional methods.

Accordingly, it is a main object of the present invention to provide a method for removing the polymer. This invention can strip the polymer protected layer by way of using the Ultra Dilute Hydrofluoric Acid (UDHF) with high flow rate, so as to reduce the loss of the oxide layer. Hence, the present invention is appropriate for deep sub-micron technology in providing semiconductor devices.

Another object of the present invention is to provide a process for removing the residual polymer. The present invention can perform a wet etching process as a Standard Clean 1 (SC1) with a low temperature by way of using a solution of mixed-acid (Amonia Peroxide Mixture; APM) to completely remove the protected layer of polymer and hence a decrease in oxide loss. Furthermore, this invention can reduce the particles from Sulfuric acid Peroxide Mixture (SPM), and keep the thickness of oxide so that the characteristics of the devices does not shift. Therefore, this invention can reduce the complexity of the conventional process and hence reduce costs. Thus, the present invention can correspond to economic effect.

In accordance with the present invention, a new method for forming the semiconductor devices is disclosed. First of all, a semiconductor substrate that has a memory array and a periphery region thereon is provided, wherein the memory array and the periphery region have a conducted layer, individually. Then an oxide layer or an oxide-nitride-oxide layer is formed on the conducted layer. Afterward, forming a photoresist layer on the oxide layer and defining the photoresist layer of the periphery region. The oxide layer and the conducted layer of the periphery region are etched until exposing the substrate surface of the periphery region by way of using a dry etching process and the photoresist layer as an etching mask. After the dry etching process is finished, a protected layer of the polymer will be formed on the etched sidewalls, so as to keep the etched profile. A wet etching process having a ultra dilute hydrofluoric acid (UDHF) or a mixed-acid solution SC1 is then performed to strip the protected layer of the polymer, so as to avoid the oxide loss.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

These preferred embodiments of the present invention are now described in greater detail. Nevertheless, it should be recognized that the present invention can be practiced in a wide range of other embodiments besides those explicitly described, and the scope of the present invention is expressly not limited except as specified in the accompanying claims.

Figure 1A:
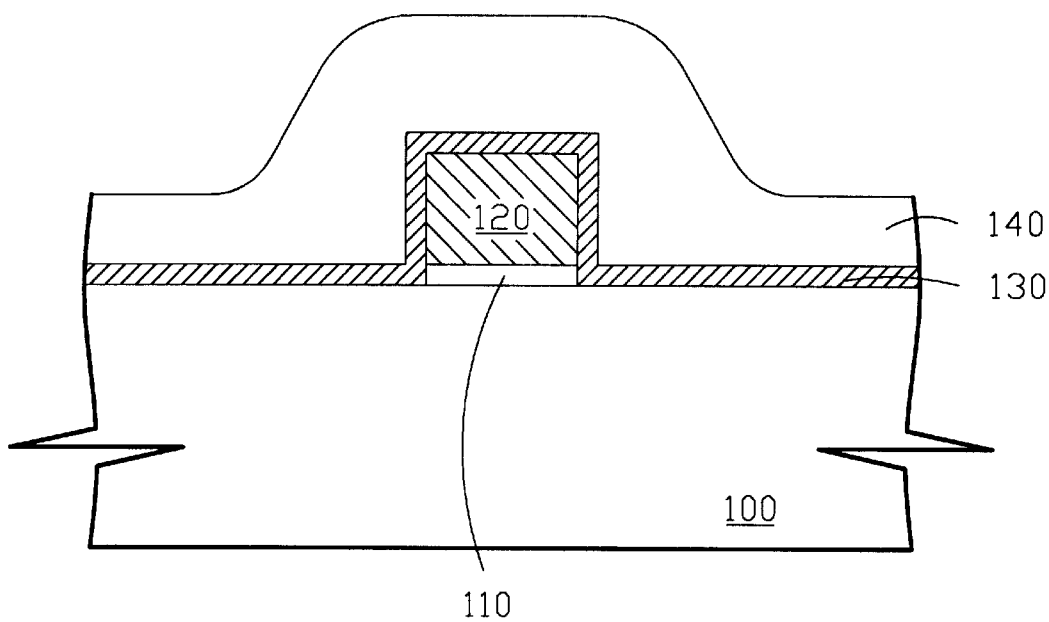
FIG. 1A to FIG. 1C show cross-sectional views illustrative of various stages for removing the protected layer of the polymer by way of using a ultra dilute hydrofluoric acid (UDHF) solution with a high flow rate in accordance with the first embodiment of the present invention.

As illustrated in FIG. 1A, in the first embodiment of the present invention, a semiconductor substrate 100 is provided. Then a gate 120, such as a polysilicon gate, having a first oxide layer 110, is formed on the semiconductor substrate 100 by way of using a photolithography process. Afterward, a second oxide layer 130 is conformed on the gate 120 and the semiconductor substrate 100. Next, depositing a dielectric layer 140, such as a nitride layer, is formed on the second oxide layer 130.

Figure 1B:
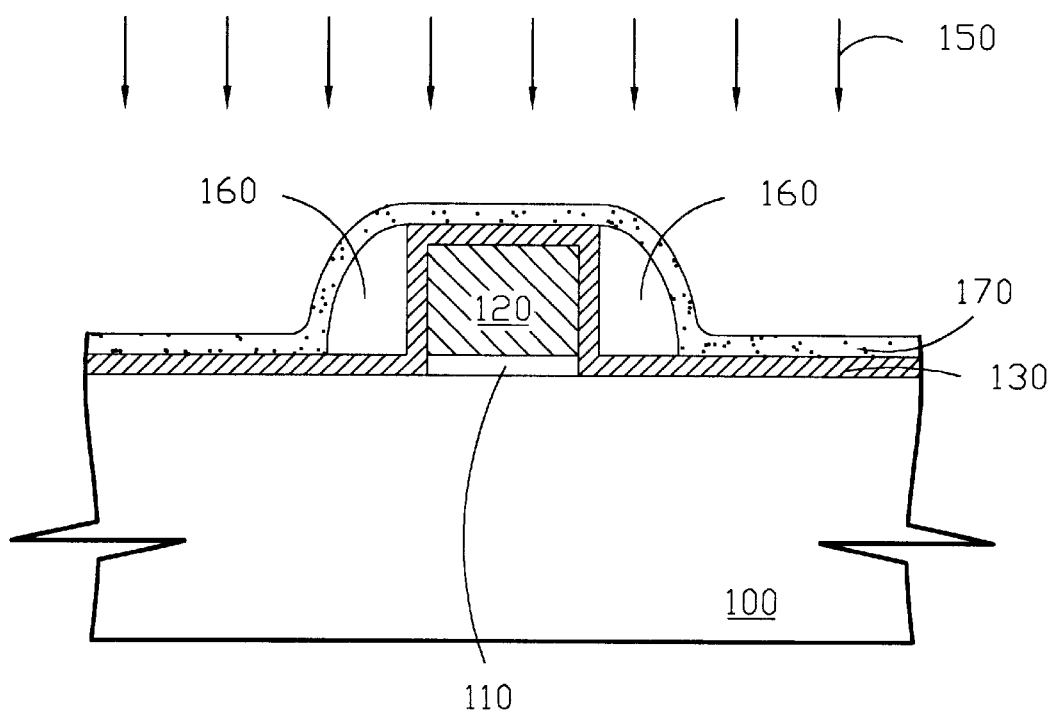

Referring to FIG. 1B, in this embodiment, the dielectric layer 140 is etched until exposing the surface of the second oxide layer 130. This is done by way of using of an anisotropic etching process 150, such as a dry etching process, and the second oxide layer 130 as an etched stop layer, so as to form a spacer 160 on the sidewall of the gate 120. When the anisotropic etching process 150 is finished, a protected layer of the polymer 170 is formed on the dielectric layer 140 in order to keep the etched profile. Furthermore, the anisotropic etching process 150 of above comprises a reacted gas with a high carbon/fluorine (C/F) ratio, such as $C_4F_8$, $CHF_3$.

Figure 1C:
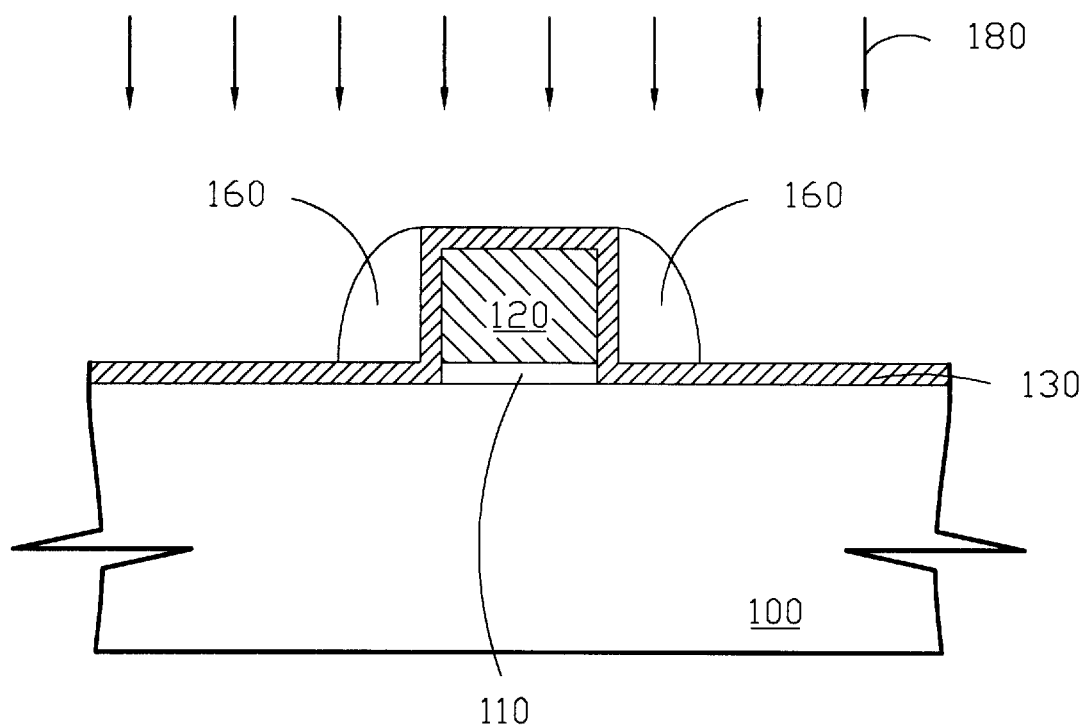

Referring to FIG. 1C, in this embodiment, performing a removing process 180 to strip the protected layer of the polymer 170, wherein the removing process 180 comprises an isotropic etching process, such as a wet etching process. The removing process 180 comprises a solution of the ultra dilute hydrofluoric acid (UDHF), and the mixed-ratio of the ultra dilute hydrofluoric acid (UDHF) is about 700:1 to 1500:1, and flow rate of the ultra dilute hydrofluoric acid (UDHF) is about more than 3000 cc/mm.

Figure 2A:
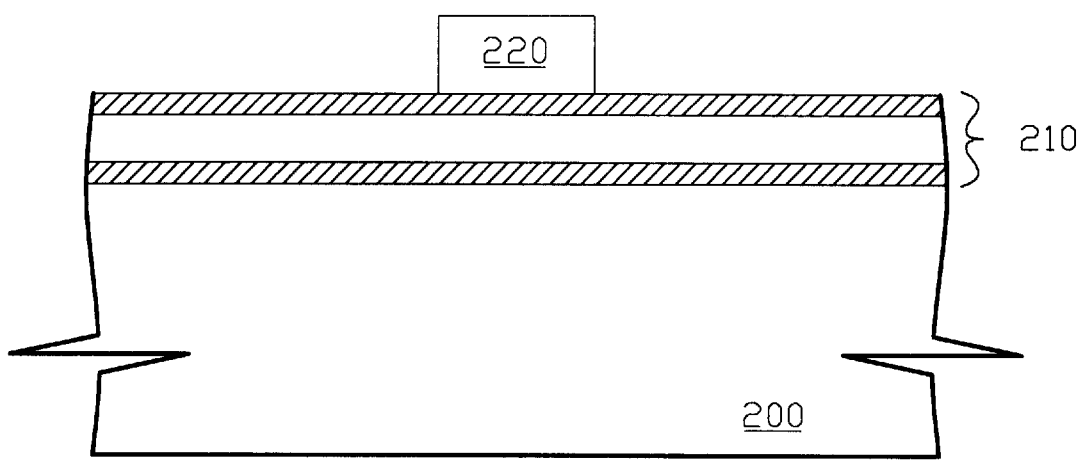
FIG. 2A to FIG. 2C show cross-sectional views illustrative of various stages for removing the protected layer of the polymer by way of using a mixed-acid SC1 solution with a low temperature in accordance with the second embodiment of the present invention.
Figure 2B:
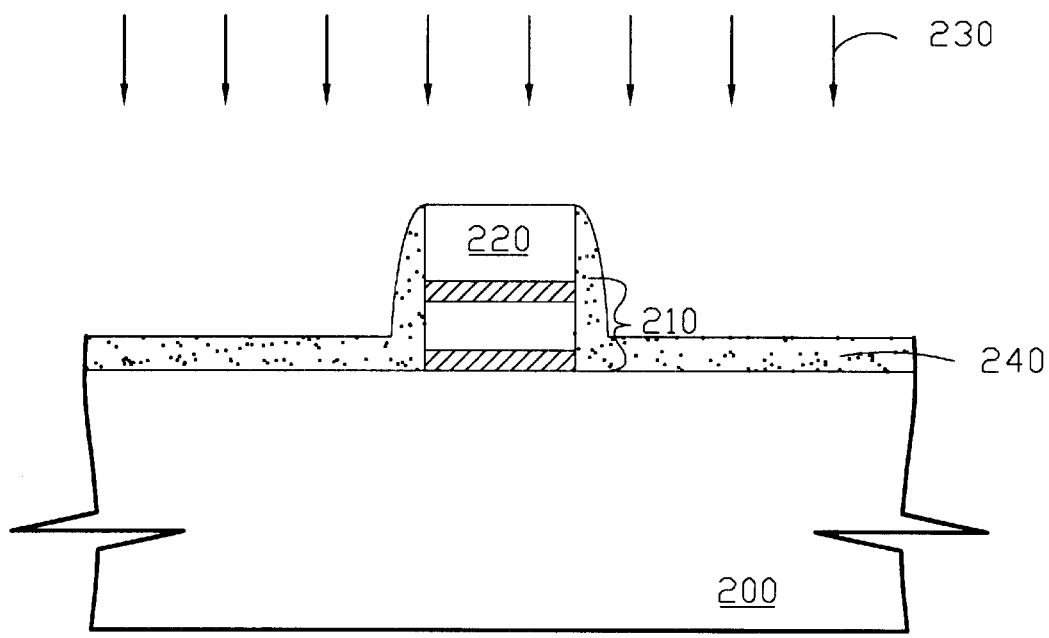

As illustrated in FIG. 2A, in the second embodiment of the present invention, a semiconductor substrate 200 is provided. Then an oxide-nitride-oxide layer 210 is formed on the semiconductor substrate 200. Afterward, forming and defining a photoresist layer 220 on the oxide-nitride-oxide layer 210. Next, the oxide-nitride-oxide layer 210 is etched until exposing the semiconductor substrate 200 by way of using a dry etching process 230. The photoresist layer 220 is used as an etching mask and then a protected layer of the polymer 240 is formed on the etched sidewall and the semiconductor substrate 200 after the dry etching process 230 is finished, so as to keep the etched profile, as shown in FIG. 2B. The dry etching process 230 of above comprises a reactive gas having a high ratio of carbon/fluorine (C/F), such as $C_4F_8$, $CHF_3$.

Figure 2C:
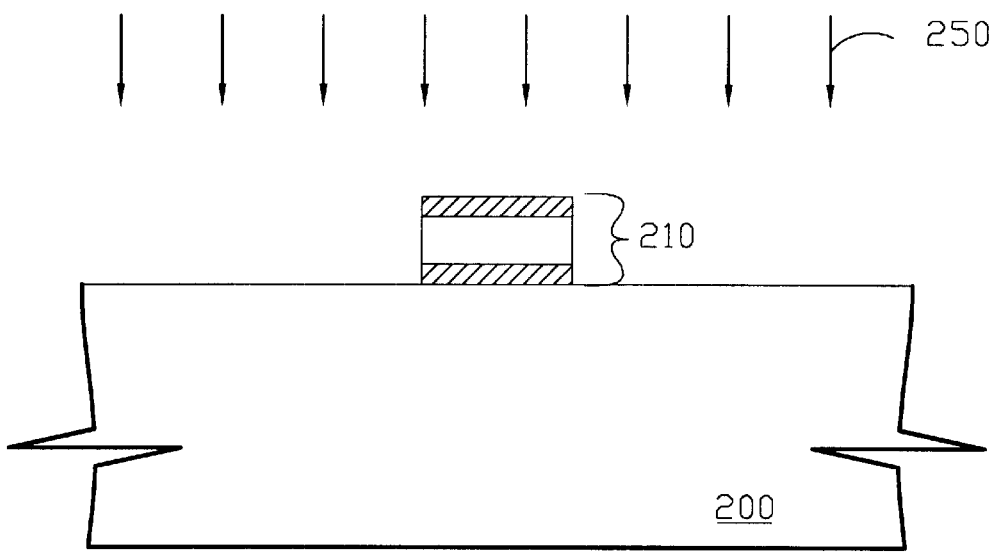

Referring to FIG. 2C, in this embodiment, stripping the photoresist layer 220. A removing process 250 is performed to strip the protected layer of the polymer 240, wherein the removing process 250 comprises a wet etching process (SC1). The removing process 250 comprises a solution of a mixed-acid (APM) with a low temperature, wherein the mixed-acid (APM) solution comprises a $NH_4OH$, a $H_2O_2$ and a Deionized water, and that the mixed-ratio is about 1:1:5 to 1:1:40. Furthermore, the temperature is about less than 35° C.

Figure 3A:
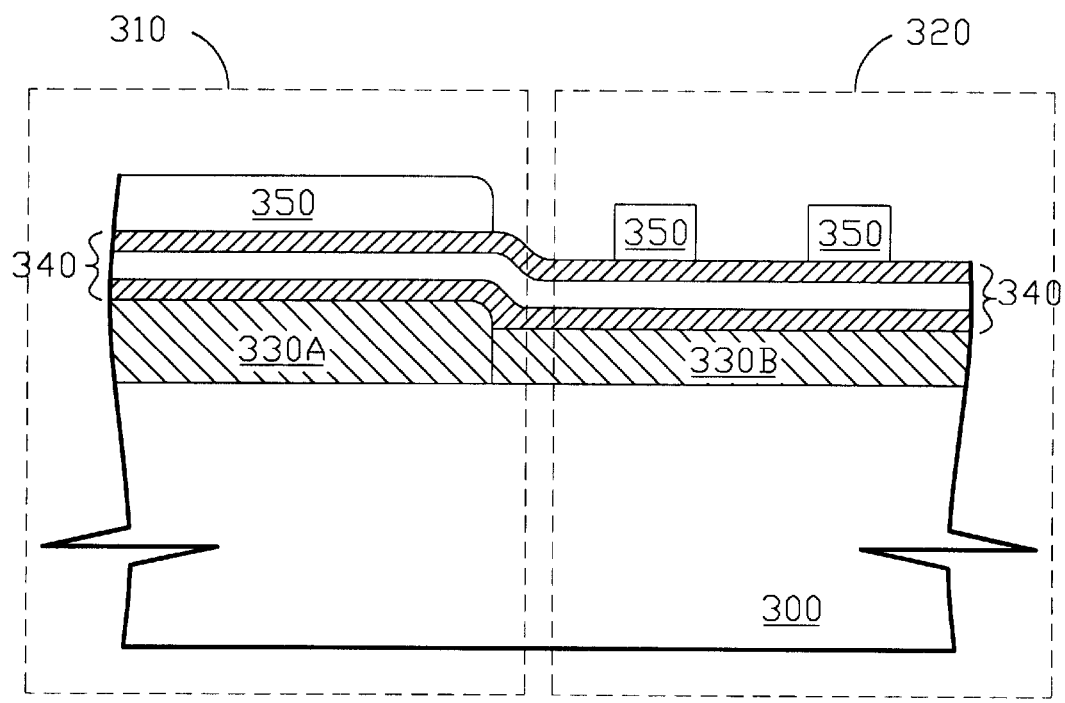
FIG. 3A to FIG. 3C show cross-sectional views illustrative of various stages for removing the protected layer of the polymer by way of using a ultra dilute hydrofluoric acid (UDHF) with a high flow rate and a mixed-acid SC1 solution with a low temperature in accordance with the third embodiment of the present invention.
Figure 3B:
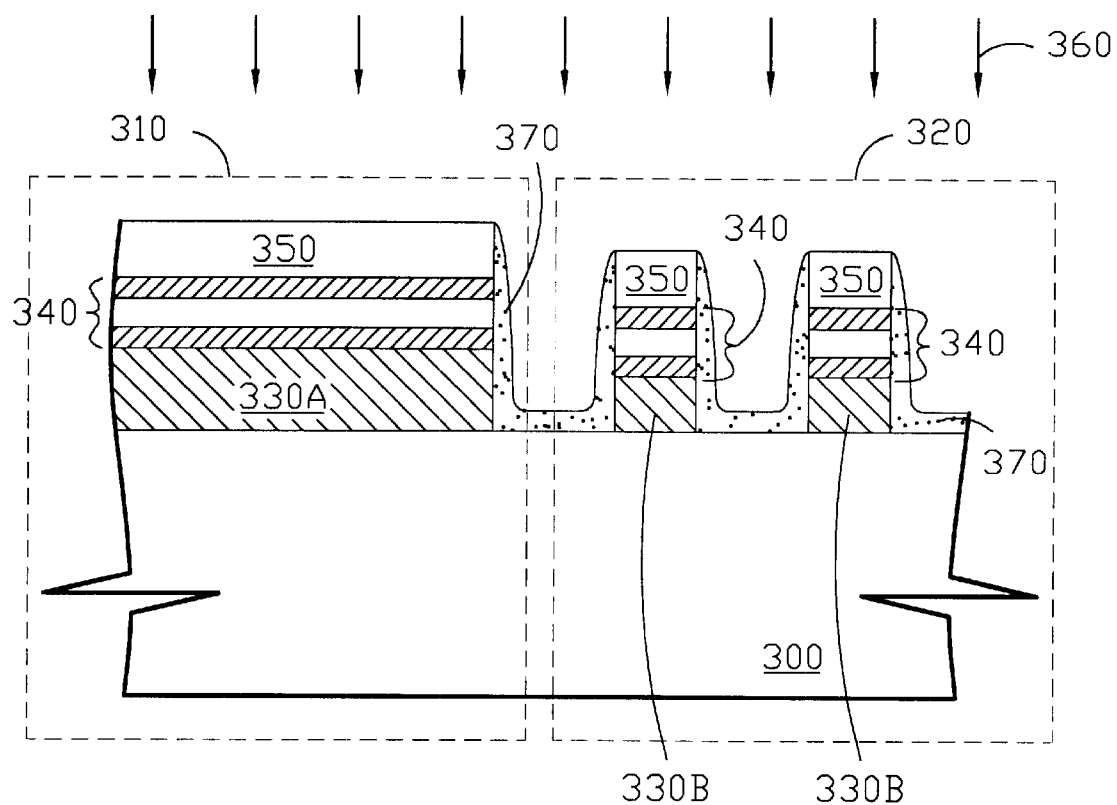

As illustrated in FIG. 3A, in the third embodiment of the present invention, a semiconductor substrate 300 that has a memory array 310 and a periphery region 320 thereon is provided, wherein the memory array 310 and the periphery region 320 have a poly layer 330A and 330B, individually. Then an oxide-nitride-oxide layer (ONO) 340 is formed on the poly layer 330A and 330B. Afterward, a photoresist layer 350 is formed on the oxide-nitride-oxide layer (ONO) 340 and defines the photoresist layer 350 of the periphery region 320. A dry etching process 360 to etch the oxide-nitride-oxide layer (ONO) 340 and the poly layer 330B of the periphery region 320 is performed until the substrate 300 surface of the periphery region 320 is exposed by way of using the photoresist layer 350 as an etching mask. After the dry etching process 360 is finished, a protected layer of the polymer 370 will be formed on the etched sidewalls of the memory array 310 and the periphery region 320, so as to keep the etched profile, as shown in FIG. 3B. The dry etching process 360 of above comprises a reactive gas having a high ratio of carbon/fluorine (C/F), such as $C_4F_8$, $CHF_3$.

Figure 3C:
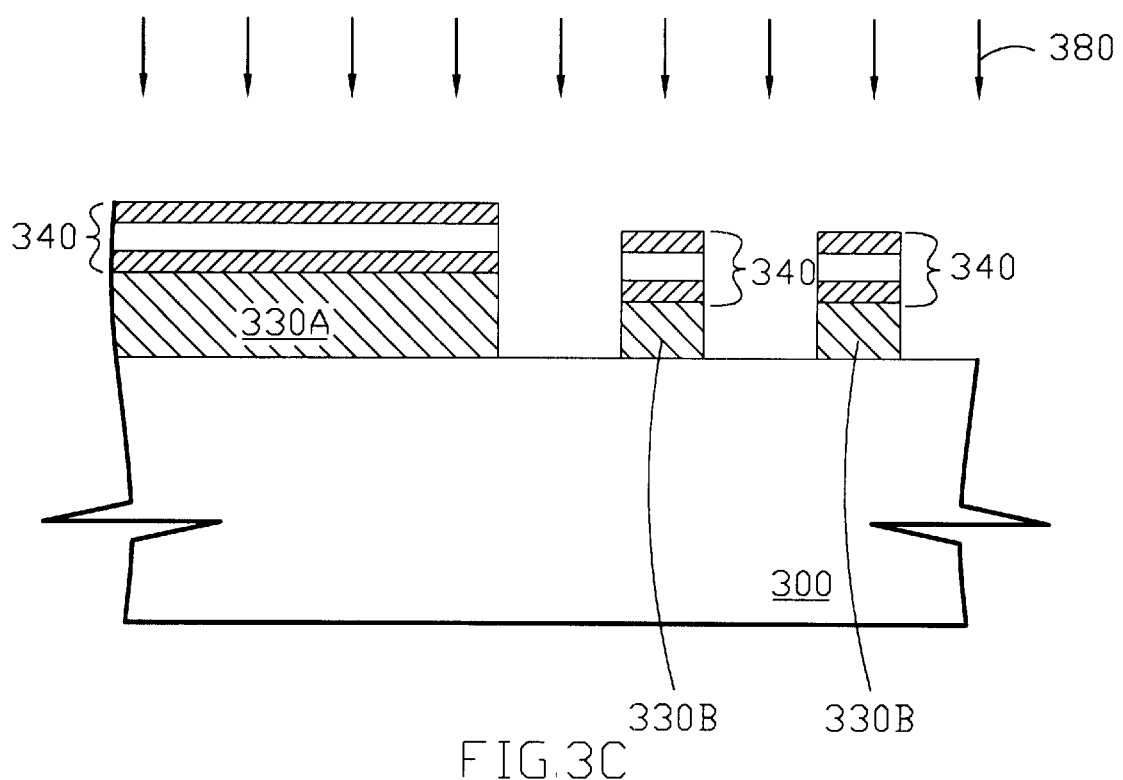

Referring to FIG. 3C, in this embodiment, stripping the photoresist layer 350. Then a wet etching process 380 is performed to remove the protected layer of the polymer 370, wherein the wet etching process 380 comprises a solution of the ultra dilute hydrofluoric acid (UDHF) and a solution of the mixed-acid SC1. Furthermore, The ultra dilute hydrofluoric acid (UDHF) comprises a mixed-ratio that is about 700:1 to 1500:1, and a flow rate that is about more than 3000 cc/mm. Moreover, the solution of the mixed-acid SC1 comprises a $NH_4OH$, a $H_2O_2$ and a Deionized water, and that the mixed-ratio is about 1:1:5 to 1:1:40, and the temperature is about less than 35° C., whereby avoiding the oxide loss.

In these embodiments of the present invention, as discussed above, this invention can strip the protected layer of the polymer by way of using the Ultra dilute Hydrofluoric Acid (UDHF) with high flow rate, so as to reduce the loss of the oxide layer. Hence, the present invention is appropriate for deep sub-micron technology in providing semiconductor devices. Furthermore, the present invention can perform a wet etching process (SC1) with a low temperature by way of using a solution of mixed-acid (APM) to completely remove the protected layer of the polymer and hence the oxide loss decrease. In this invention, the oxide loss will be decreased to about than 6 Å. On the other hand, this invention can reduce the particles from sulfuric acid peroxide mixture (SPM), and keep the thickness of oxide, so that the characteristic of the devices does not shift. Therefore, this invention can reduce the complexity of the conventional process and hence cost reduction. Thus, the present invention can correspond to economic effect.

Of course, it is possible to apply the present invention to the process for removing the residual polymer, and it is possible for the present invention to be applied to any etching process in the semiconductor device production. Furthermore, at the present time, the ultra dilute hydrofluoric acid and the mixed-acid (APM) solution in this invention can be applied to avoid the oxide loss concerning the process for removing the residual polymer. The method of the present invention is the best process for removing the polymer compatible process for deep sub-micron process.

Obviously, many modifications and variations of the present invention are possible in light of the above teachings. It is to be understood that within the scope of the appended claims, the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A method for removing a protected layer of the polymer, the method comprising:

providing a semiconductor substrate having a gate thereon;

conforming an oxide layer is conformed on said gate and said semiconductor substrate;

forming a dielectric layer on said oxide layer;

performing an anisotropic etching process by way of using said oxide layer as an etched stop layer to etch said dielectric layer until exposing the surface of said oxide layer, so as to form a spacer on a sidewall of said gate, and then a protected layer of the polymer is formed on said spacer and said oxide layer in order to keep the etched profile after said anisotropic etching process is finished; and performing a removing process with a solution of hydrofluoric acid that has a mixed-ratio about 700:1 to 1500:1 and a flow rate about more than 3000 cc/mm to strip said protected layer of the polymer and avoid said oxide layer loss.

2. The method according to claim 1, wherein said dielectric layer comprises an nitride layer.

3. The method according to claim 1, wherein said anisotropic etching process comprises a dry etching process.

4. The method according to claim 1, wherein said anisotropic etching process comprises a reacted gas that has a high carbon/fluorine (C/F) ratio.

5. The method according to claim 1, wherein said removing process comprises an isotropic etching process.

6. The method according to claim 5, wherein said isotropic etching process comprises a wet etching process.

7. The method according to claim 1, wherein said removing process comprises a wet etching process.

* * * * *